United States Patent [19]

Podkowa et al.

[11] Patent Number: 4,876,465
[45] Date of Patent: Oct. 24, 1989

[54] DYNAMIC CMOS BUFFER FOR LOW CURRENT SWITCHING

[75] Inventors: William J. Podkowa; Clark R. Williams, both of Plano, Tex.

[73] Assignee: Dallas Semiconductor Corporation, Dallas, Tex.

[21] Appl. No.: 208,287

[22] Filed: Jun. 17, 1988

[51] Int. Cl.[4] .................. H03K 17/16; H03K 19/094; H03K 3/01

[52] U.S. Cl. .................................. 307/443; 307/451; 307/452; 307/481; 307/572; 307/576; 307/296.5; 307/296.6

[58] Field of Search ............... 307/443, 448, 451, 452, 307/453, 481, 572, 576, 296.5, 296.6

[56] References Cited

U.S. PATENT DOCUMENTS 4,700,086 10/1987 Ling et al. ........................... 507/443

Primary Examiner—Stanley D. Miller
Assistant Examiner—Margaret Rose Wambach
Attorney, Agent, or Firm—Worsham, Forsythe, Sampels & Wooldridge

[57] ABSTRACT

A sense circuit for sensing the transition of an input signal from a first logic state to a second logic state and making a corresponding logic transition on the output at a higher slew rate includes a first buffer stage having a complementary pair of transistors consisting of P-channel transistor (34) and N-channel transistor (32) having the drains thereof isolated by N-channel transistor (26). A precharge signal is connected to the gates of the transistors (34) and (32) to turn on transistor (32) and pull the drain thereof low. The drain of transistor (32) is connected to the gate of N-channel transistor (36). The P-channel transistor (26) is connected to an input signal and is operable to connect the drain of transistor (34) to the gate of transistor (36) when transistor (32) is turned off. This results in a node (38) being pulled from a high logic voltage to a low logic voltage when the input signal falls one $V_T$ below the source of transistor (26).

15 Claims, 1 Drawing Sheet

DYNAMIC CMOS BUFFER FOR LOW CURRENT SWITCHING

TECHNICAL FIELD OF THE INVENTION

The present invention pertains in general to CMOS buffers and, more particularly, to a CMOS buffer utilized with a low slew rate input signal and having a low current requirement during switching.

BACKGROUND OF THE INVENTION

As the density of integrated circuits has increased in recent years, the demand for lower power circuit elements has also increased in order to lower overall power consumption and improve heat dissipation. Standby power consumption in conventional TTL and CMOS circuits is generally relatively low. Typically, TTL logic gates are fabricated with bipolar transistors that source or sink current to a resistance load which, in a static mode, have a defined standby current. CMOS circuits, on the other hand, are configured of complementary P- and N- channel transistors wherein the P-channel transistor is operable to pull a node high and the N-channel transistor is operable to pull the node low. However, with a CMOS circuit, the P-channel transistor is turned off when the N-channel transistor is turned on, thus drawing minimal current from the power supply in a static mode. Therefore, CMOS circuits result in considerably less current drain on the power supply as compared to TTL circuits.

Although CMOS circuits result in significantly lower current drain on a power supply, recent industry demands for battery protected circuitry has required even lower current drain. For example, some battery backed up circuitry must have battery lifetimes that exceed ten years with extremely small current drains. Although a CMOS circuit in the static condition draws minimal current, a problem does exist during switching between logic states. The current draw due to switching the CMOS circuit is the result of the transition of the gate voltage on the complementary pair wherein one transistor in the pair is turned on prior to the other transistor being turned off during this transition.

For example, when the N-channel transistor is initially on, as the result of a high gate voltage, switching of the gate voltage to a low voltage will turn on the P-channel transistor and turn off the N-channel transistor. As the gate voltage goes negative, the P-channel transistor is turned on when the gate voltage is one $V_T$ less than the source voltage. However, this voltage may still be greater than one $V_T$ above the source of the N-channel transistor and, therefore, the N-channel transistor will continue to draw current through the P-channel transistor. As the gate voltage falls below the $V_T$ of the N-channel transistor, the N-channel transistor turns off. Therefore, when the voltage on the gates of the complementary pair is between one $V_T$ below the source of the P-channel transistor and one $V_T$ above the source of the N-channel transistor, current is conducted through the pair. For extremely low current drain applications such as battery backed up parts, this current drain can be considerable during the switching of the gate. Further, for very low slew rate input signals, this situation can be exacerbated. Therefore, conventional CMOS circuits utilized in buffers and inverters have significant disadvantages in low-current applications, especially for low slew rate input signals. There therefore exists the need for improvements in CMOS circuitry utilized to buffer or invert low slew rate signals to minimize the current drain during switching.

SUMMARY OF THE INVENTION

The present invention disclosed and claimed herein comprises a gating circuit for increasing the slew rate of low slew rate input signal and minimizing power drain during the switching operation. The gate includes a first stage of amplification which has an input node and an output node. The output node is operable to be precharged to a low voltage during the precharge cycle when the input node is pulled to a logic high. During switching, the output node is pulled to a high reference voltage. A switch is disposed between the pull-up circuit and the output node and is operable to isolate the pull-up circuit from the output node during the precharge cycle. The switching element becomes conductive when the input voltage falls below a predetermined threshold and has a transconductance with a square law current relationship.

In one aspect of the present invention, the pull-up circuit is realized with a P-channel transistor and the precharge circuit is realized with an N-channel transistor. The N-channel transistor has the source-to-drain path thereof connected between the output node and ground and the gate thereof connected to a precharge clock. The P-channel transistor has the source-to-drain path thereof connected between an intermediate node and a power supply and the gate thereof connected to the precharge clock. The transconductance element comprises a switching P-channel transistor having the gate thereof connected to the input node and the source-to-drain path thereof connected between the intermediate node and the output node. The precharge signal is a high slew rate signal whereas the input node is a low slew rate signal. Therefore, the P-channel pull-up transistor is turned off when the N-channel precharge transistor is turned on. The switching P-channel transistor isolates the output node from the intermediate node during precharge such that current is not drawn.

In yet another aspect of the present invention, an additional stage of gain is provided with an N-channel transistor that has the gate thereof connected to the output node of the first stage and the source thereof connected to ground. The drain of the N-channel transistor is precharged to a high logic state during the precharge cycle and then allowed to float during the switching cycle. When the gate of the N-channel transistor goes high, the drain thereof is pulled low to provide additional amplification.

BRIEF DESCRIPTION OF THE DRAWINGS

For a more complete understanding of the present invention and the advantages thereof, reference is now made to the following description taken in conjunction with the accompanying Drawings in which.

Figure 1:
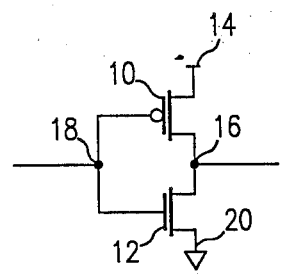
FIG. 1 illustrates a schematic diagram of a prior art CMOS inverter.

It will be appreciated that for purposes of clarity and where deemed appropriate, reference numerals have been repeated in the figures to indicate corresponding features.

DETAILED DESCRIPTION OF THE INVENTION

Referring now to FIG. 1, there is illustrated a schematic diagram of a prior art CMOS inverter. The CMOS inverter is comprised of a P-channel transistor 10 and an N-channel transistor 12. The P-channel transistor 10 has the source thereof connected to a supply terminal 14 and the drain thereof connected to an output node 16. Node 16 has a capacitance associated therewith that is a combination of the drain capacitance of transistors 10 and 12 and a capacitive load (now shown). The gate of P-channel transistor 10 is connected to an input node 18. The N-channel transistor 12 has the source thereof connected to a ground terminal 20, the drain thereof connected to the output node 16 and the gate thereof connected to the input node 18.

In operation of the prior art device of FIG. 1, a low logic state on the input node 18 results in the P-channel transistor 10 being turned on and the N-channel transistor 12 being turned off. As such, the P-channel transistor provides a resistance path to charge up the capacitance on node 16. When the input signal on input node 18 is a logic high, the P-channel transistor 10 is turned off and N-channel transistor 12 is turned on, pulling node 16 to the ground terminal 20 and discharging the capacitance on node 16.

Each of the transistors 10 and 12 provide a series resistance between either the power supply terminal 14 and the output node 16 or the ground terminal 20 and output node 16. Since the inputs to the various CMOS gates in a CMOS circuit are relatively high impedance, the only current drawn is the current necessary to charge the capacitance on the output node 16. However, during switching, from, for example, a low logic state to a high is turned logic state, one transistor must be turned on and the other transistor turned off in order to prevent a static current from flowing between the power supply terminal 14 and ground terminal 20. When the voltage on the input terminal 18 is low, P-channel transistor 10 is turned on and N-channel transistor 12 is turned off. When the voltage goes from a low voltage to a high voltage, N-channel transistor 12 is turned on when the voltage exceeds the $V_T$ of transistor 12. However, P-channel transistor 10 and N-channel transistor 12 are both turned on until the input voltage is greater than one $V_T$ below the power supply voltage on power supply terminal 14. Current path is provided from the power supply terminal 14 to the ground terminal 20 resulting in undesired current drain. For a very fast slew rate input voltage, this current drain is minimal as compared to the overall operating current in the system. However, this current significantly increases as the input slew rate decreases.

Figure 2:
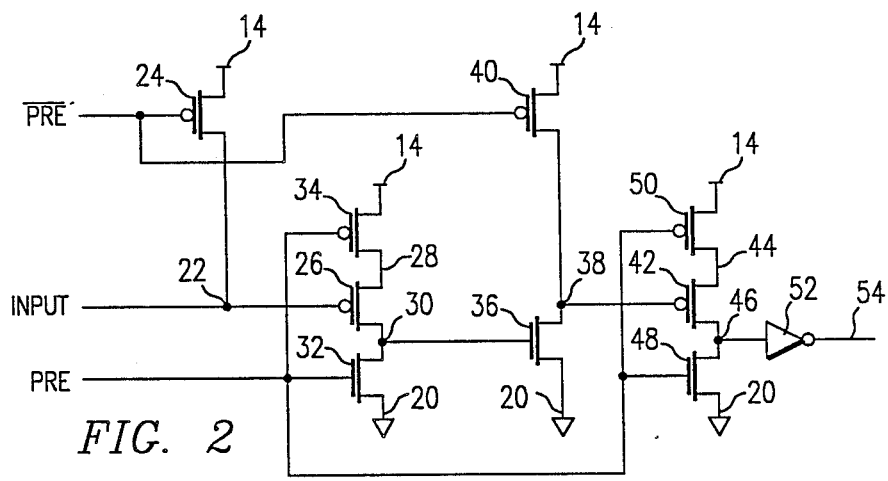
FIG. 2 illustrates a schematic diagram of the gate of the present invention.

Referring now to FIG. 2, there is illustrated a schematic diagram of the dynamic gate of the present invention. The input signal is received on an input node 22 and is operable to make the transition from a high logic state to a low logic state. It is this transition that is sensed by the circuit of FIG. 2 and translated to the output of the circuit on an output node wherein minimal current is drawn from the power supply node 14 to the ground node 20 irrespective of the slew rate of the input signal. Additionally, the slew rate of the output signal is significantly increased such that it is compatible with remaining gates in the system.

The input node is initially precharged through a P-channel transistor 24 which has the source thereof connected to a power supply terminal 14, the drain thereof connected to the node 22 and the gate thereof connected to a precharge-bar signal PRE-bar. The input node 22 is also connected to the gate of the P-channel transistor 26. P-channel transistor 26 has the source thereof connected to a node 28 and drain thereof connected to a node 30 to provide a source-to-drain path therebetween when the voltage on the input node 22 is one $V_T$ below the voltage on node 28. An N-channel transistor 32 is provided having the source thereof connected to the ground terminal 20, the drain thereof connected to the node 30 and the gate thereof connected to a precharge signal PRE. A P-channel transistor 34 is provided having the source thereof connected to the power supply terminal 14, the drain thereof connected to node 28 and the gate thereof connected to the PRE signal.

The node 30 is connected to the gate of N-channel transistor 36, the source of which is connected to ground terminal 20, and the drain of which is connected to a node 38. A P-channel transistor 40 is provided having the source thereof connected to the power supply terminal 14, the drain thereof connected to node 38 and the gate thereof connected to the PRE-bar signal. The node 38 is connected to the gate of a P-channel transistor 42 which has the source thereof connected to a node 44 and the drain thereof connected to a node 46. An N-channel transistor 48 is provided having the source thereof connected to the ground terminal 20, the drain thereof connected to the node 46 and the gate thereof connected to the PRE signal. A P-channel transistor 50 is provided having the source thereof connected to the power supply terminal 14, the drain thereof connected to the node 44 and the gate thereof connected to the PRE signal. The transistors 42, 48 and 50 are configured similar to the transistors 26, 32 and 34. The node 46 is connected to the input of a standard CMOS inverter 52, the output of which is connected to the output node 54 of the circuit in FIG. 2.

Figure 3B:
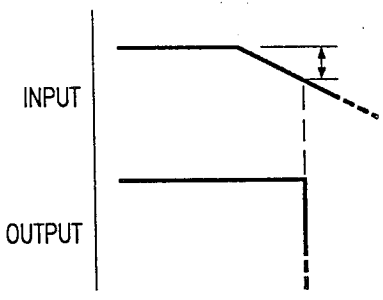
FIGS. 3a and 3b illustrate timing diagrams for the operation of the present invention.
Figure 3A:
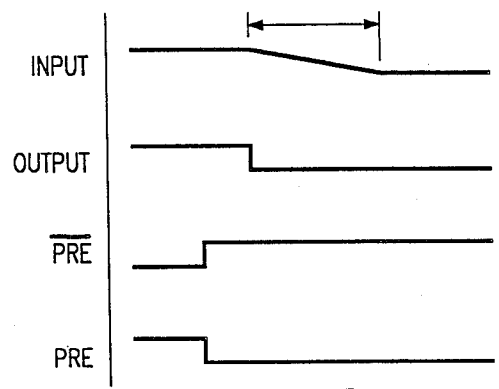

With reference to FIGS. 3a and 3b, the operation of the circuit in FIG. 2 will be described. Initially, the PRE signal is high and the PRE-bar signal is low. When PRE-bar is low, P-channel transistor 24 is turned on, pulling input node 22 to a high logic level, thus precharging the input node 22. Although not described herein, node 22 is connected to a long conductive run in an address decode circuit with the P-channel transistor 24 providing the precharge operation of that line. This node therefore has a high capacitance associated therewith. However, the precharge transistor 24 can have the function thereof provided by other peripheral circuitry associated with the input driving circuitry. The input node 22, due to its large associated capacitance, will have a low slew rate during precharge to a high logic state and switching to a low logic state.

The PRE signal is high during precharge to turn off transistor 34 and turn on transistor 32. This results in node 30 being pulled low to turn off transistor 36. It should be noted that the precharge clock is a very high slew rate clock such that current drain from the power supply terminal 14 and the ground terminal 20 during switching in the precharge cycle is minimized. Transistor 34 prevents current flowing from the power supply node 14 through transistor 26 when PRE goes high and PRE-bar goes low turning on transistor 24. Since node 22 has a low slew rate associated therewith, transistor 26 conducts for a short time during switching, which, without transistor 34, would result in current drain. The P-channel transistor 40 is turned on when the PRE-bar signal goes low, pulling node 38 high, since transistor 36 is turned off. Node 38 turns off transistor 42 and the PRE signal turns off transistor 50 and turns on transistor 48. Transistor 48, during the precharge cycle, pulls node 46 low. Therefore, during precharge, node 30 is pulled low, node 46 is pulled low, and node 38 is pulled high. When node 46 is pulled low, output node 54 is pulled high. The precharge operation is operable to switch the output from a logic low to a logic high. After precharge, the PRE signal goes low and the PRE-bar signal goes high. This results in node 28 being pulled high and node 44 being pulled high.

Once the circuit of FIG. 2 has been precharged, the circuit remains in a static state with nodes 28 and 44 pulled high and nodes 30, 38 and 46 floating, since N-channel transistors 32, 36 and 48 are turned off and P-channel transistors 26, 40 and 42 are turned off. When the input node 22 begins to go low as a result of a transition form a logic high to a logic low, transistor 26 begins to conduct when node 22 falls one $V_T$ below the power supply voltage. This is illustrated in FIG. 3b. The transistor 26 begins to conduct once its threshold voltage has been exceeded to pull node 30 up to the potential of node 28. Since the only loading on node 30 is the capacitive loading of the gate of transistor 36, this happens very quickly. It should be noted that transistor 32 is turned off and therefore, current does not flow from node 28 to the ground terminal.

Once the $V_T$ of transistor 36 is exceeded, node 38 is puled low, turning on transistor 42 and pulling node 46 high. This results in the output of inverter 52 going low. The N-channel transistor 36 provides a stage of gain to the node 30 that allows node 30 to be pulled high when the threshold of the transistor 26 is exceeded. It is important that node 38 be pulled low at a much faster rate than the slew rate of the input node 22. The output stage consisting of transistors 42, 48 and 50 further amplifies this speed when the voltage on node 38 falls below the voltage on node 44 by one $V_T$. This occurs even faster than the voltage on node 22 falling one $V_T$ below the voltage on node 28 and, therefore, the voltage on node 46 changes at an even faster rate than the voltage change on node 38. This increased slew rate on node 46 is sufficient to drive the input of the CMOS inverter 52 with only minimal current draw when switching.

In summary, there has been provided a circuit for sensing the transition of a low slew rate signal from a first logic state to a second logic state. The circuit determines when the input signal falls below a predetermined threshold and then the logic state of the output is pulled low at a high slew rate.

Although the preferred embodiment has been described in detail, it should be understood that various changes, substitutions and alterations can be made therein without departing from the spirit and scope of the invention as defined by the appended claims.

What is claimed is:

1. A gate circuit for buffering a low slew rate input signal with minimum power drain, comprising:
   an input node;
   a first capacitive node;
   a second capacitive node;
   precharge means for operating during a precharge cycle to pull the second capacitive node to a low reference voltage to allow said second capacitive node to float when not in the precharge node, said input node disposed at a logic high during said precharge cycle and said second capacitive node pulled to a high reference voltage when not operating in said precharge cycle;
   switch means operative during said precharge cycle to isolate said first and second capacitive nodes and in a switching mode to connect said first and second capacitive nodes together;
   said switch means operating in the switching mode when said input node falls below a predetermined threshold voltage: and
   means for interfacing said second capacitive node to an output node;
   wherein the slew rate of the output node is a function of the rate with which said second capacitive node is pulled from said low reference voltage to said high reference voltage during the switching cycle;
   wherein said precharge means comprises:
   a P-channel transistor having the source-to-drain path thereof connected between said high reference voltage and said first capacitive node;
   an N-channel transistor having the source-to-drain path thereof connected between said second capacitive node and said low reference voltage;
   the gates of said P-channel and N-channel transistors being connected together and to a precharge clock which operates at a high logic voltage in the precharge cycle and a low logic voltage in the switching mode; and
   a P-channel transistor having the source-to-drain path thereof connected between said input node and said high reference voltage and the gate thereof connected to a logic low during said precharge cycle and to a logic high during said switching mode to pull said input node to a logic high during said precharge cycle.

2. The gate circuit of claim 1 wherein said switching means comprises a P-channel transistor having the source-to-drain path thereof connected between said first and second capacitive nodes and the gate thereof connected to said input node.

3. A gate circuit for increasing the slew rate of an input transition with minimum power drain, comprising:
   an input node;
   an output node;
   first precharge means for precharging said output node to a low reference voltage during the precharge cycle;
   second pull-up means operable to raise said output node to a high reference voltage during a switching cycle occurring after said precharge cycle:
   a transconductance switching element being disposed between said output node and said pull-up means to isolate said pull-up means from said output node during said precharge cycle and to connect said pull-up means to said output node during said switching cycle, said switching element having a square law voltage/ current relationship as the function of the input voltage to said transconductance element that is connected to said input node, said switching element operating in response to said input node falling below a predetermined threshold wherein said output node is pulled up to said high reference voltage at a slew rate that is faster than the slew rate on said input node;
   wherein said pull-up means comprises a P-channel transistor having the source-to-drain path thereof connected between said high reference voltage and said switching element and said first precharge means comprises an N-channel transistor having the source-to-drain path thereof connected between said output node and said low reference voltage, the gates of said P-channel transistor and said N-channel transistor connected to a precharge signal that is a logic high during the said precharge cycle and a logic low during said switching cycle.

4. The gate circuit of claim 3 wherein said transconductance switching element comprises a P-channel transistor having the source-to-drain path thereof connected between said P-channel transistor of said pull-up means and said output node, and the gate thereof connected to said input node.

5. A gate circuit for increasing the slow rate of an input transition with minimum power drain, comprising:
an input node;
an output node;
first precharge means for precharging said output node to a low reference voltage during the precharge cycle;
second pull-up means operable to raise said output node to a high reference voltage during a switching cycle occurring after said precharge cycle;
a transconductance switching element being disposed between said output node and said pull-up means to isolate said pull-up means from said output node during said precharge cycle and to connect said pull-up means to said output node during said switching cycle, said switching element having a square low voltage/ current relationship as the function of the input voltage to said transconductance element that is connected to said input node, said switching element operating in response to said input node falling below a predetermined threshold wherein said output node is pulled up to said high reference voltage at a slew rate that is faster than the slew rate on said input node;
and further comprising an additional stage of amplification, said additional stage of amplification comprising:
an input node connected to said output node;
a secondary output node;
a transconductance device connected between said secondary output node and ground and having a square law current relationship; and
second precharging means for precharging said secondary output node to said high reference voltage during said precharge cycle.

6. The gate circuit of claim 5 and further comprising a third stage having an input node connected to said secondary output node, and a tertiary output node, said third stage comprising:
third precharge means for precharging said tertiary output node to said low reference voltage during said precharge cycle;
second pull-up means for pulling said tertiary output node up to said high reference voltage during said switching cycle; and
a second transconductance element connected between said second pull-up means and said tertiary output and controlled by said secondary output, said second transconductance element having a square law current relationship as a function of the gate voltage on said secondary output.

7. The gate circuit of claim 6, wherein said second pull-up means comprises a P-channel transistor, said second precharge means comprises an N-channel transistor and said second transconductance element comprises a P-channel transistor.

8. An integrated circuit, comprising:
an input connection for receiving an incoming signal;
a first precharge transistor, connected to pull up said input connection during a precharge phase;
a second precharge transistor, connected to pull down an intermediate node during said precharge phase;
a third precharge transistor, connected to pull up a first output node during said precharge phase;
said input connection being coupled to control a fourth transistor, which can pull up said intermediate node, at times other than said precharge phase;
a fifth transistor, connected to pull up the channel of said fourth transistor at all times except during said precharge phase;
said intermediate node being coupled to control a sixth transistor, which can pull down said first output node when said intermediate node is high.

9. The integrated circuit of claim 8, wherein said first and third precharge transistors are P-channel field-effect transistors.

10. The integrated circuit of claim 8, wherein said fourth transistor is a P-channel field-effect transistor.

11. The integrated circuit of claim 8, wherein said second and sixth transistors are N-channel field-effect transistors.

12. The integrated circuit of claim 8, wherein said first through sixth transistors are insulated-gate field-effect transistors.

13. The integrated circuit of claim 8, further comprising:
a seventh transistor, connected to pull down a further output node during said precharge phase;
said output node being coupled to control an eighth transistor, which can pull up said further output node, at times other than said precharge phase;
a ninth transistor, connected to pull up the channel of said eight transistor at all times except during said precharge phase.

14. The integrated circuit of claim 13, wherein said fourth and eighth transistors are P-channel field-effect transistors.

15. The integrated circuit of claim 13, wherein said fourth and eighth transistors are P-channel field-effect transistors, and said second, sixth, and seventh transistors are N-channel field-effect transistors.

* * * * *